(12) United States Patent
Kwon et al.

(10) Patent No.: US 10,121,658 B2
(45) Date of Patent: Nov. 6, 2018

(54) METHOD OF FABRICATING BLACK PHOSPHORUS ULTRATHIN FILM AND BLACK PHOSPHORUS ULTRATHIN FILM THEREOF

(71) Applicant: KOREA RESEARCH INSTITUTE OF STANDARDS AND SCIENCE, Daejeon (KR)

(72) Inventors: Hyuksang Kwon, Daejeon (KR); Jeong Won Kim, Daejeon (KR); Eun Seong Lee, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 0 days.

(21) Appl. No.: 15/576,664

(22) PCT Filed: Mar. 24, 2016

(86) PCT No.: PCT/KR2016/002977
§ 371 (c)(1),
(2) Date: Nov. 22, 2017

(87) PCT Pub. No.: WO2016/190531
PCT Pub. Date: Dec. 1, 2016

(65) Prior Publication Data
US 2018/0138039 A1 May 17, 2018

(30) Foreign Application Priority Data

May 28, 2015 (KR) .................. 10-2015-0074810
Dec. 4, 2015 (KR) .................. 10-2015-0172253

(51) Int. Cl.
*H01L 21/02* (2006.01)
*H01L 21/428* (2006.01)
*H01L 21/205* (2006.01)
*H01L 29/24* (2006.01)
(Continued)

(52) U.S. Cl.
CPC ........ *H01L 21/02664* (2013.01); *H01L 21/02* (2013.01); *H01L 21/0262* (2013.01);
(Continued)

(58) Field of Classification Search
CPC combination set(s) only.
See application file for complete search history.

(56) References Cited

U.S. PATENT DOCUMENTS

2016/0304352 A1* 10/2016 Ozyilmaz ........... C01B 31/0453
2017/0108362 A1* 4/2017 Engel ................. G01R 33/1269
(Continued)

FOREIGN PATENT DOCUMENTS

KR  1020030086660 A  11/2003
KR  1020060077681 A   7/2006

OTHER PUBLICATIONS

Favron, A. et al., "Exfoliating pristine black phosphorus down to the monolayer: photo-oxidation and quantum confinement," eprint arXiv:1408.0345v2, Available Online at https://arxiv.org/ftp/arxiv/papers/1408/1408.0345.pdf, Aug. 2014, 34 pages.
(Continued)

Primary Examiner — Mamadou Diallo
(74) Attorney, Agent, or Firm — McCoy Russell LLP (57) ABSTRACT

The present invention relates to a method of fabricating a black phosphorus thin film and a black phosphorus thin film thereof and, more particularly, to a method of fabricating a black phosphorus ultrathin film by forming the black phosphorous ultrathin film in a chamber by active oxygen and removing accompanying black phosphorus oxide film water. The black phosphorus ultrathin film has a surface that does not substantially have defects and is uniform in a large area, and has a surface roughness property of 1 nm or less, to represent a high application property to an optoelectronic device and a field effect transistor.

13 Claims, 6 Drawing Sheets

As exfoliated  UVO treat.  Rinsing  BP thin layer (51) Int. Cl.
*H01L 29/34* (2006.01)
*H01L 29/786* (2006.01)
*H01L 31/032* (2006.01)
*H01L 33/26* (2010.01)

(52) U.S. Cl.
CPC .. *H01L 21/02521* (2013.01); *H01L 21/02631* (2013.01); *H01L 21/205* (2013.01); *H01L 21/428* (2013.01); *H01L 29/24* (2013.01); *H01L 29/34* (2013.01); *H01L 29/78696* (2013.01); *H01L 31/032* (2013.01); *H01L 33/26* (2013.01)

(56) References Cited

U.S. PATENT DOCUMENTS

2017/0322166 A1* 11/2017 Zhou .................... G01N 27/122
2018/0231620 A1* 8/2018 Bruna .................... G01R 33/07

OTHER PUBLICATIONS

Zhang, S. et al., "Extraordinary Photoluminescence and Strong Temperature/Angle-Dependent Raman Responses in Few-Layer Phosphorene," ACS Nano, vol. 8, No. 9, Sep. 4, 2014, 7 pages.
Doganov, R. et al., "Transport properties of pristine few-layer black phosphorus by van der Waals passivation in an inert atmosphere," Nature Communications, vol. 6, No. 6647, Apr. 10, 2015, 7 pages.
ISA Korean Intellectual Property Office, International Search Report Issued in Application No. PCT/KR2016/002977, dated Jul. 14, 2016, WIPO, 6 pages.

\* cited by examiner

METHOD OF FABRICATING BLACK PHOSPHORUS ULTRATHIN FILM AND BLACK PHOSPHORUS ULTRATHIN FILM THEREOF

CROSS REFERENCE TO RELATED APPLICATIONS

The present application is a U.S. National Phase of International Patent Application Serial No. PCT/KR2016/002977 entitled "METHOD FOR PREPARING BLACK PHOSPHORUS THIN FILM AND BLACK PHOSPHORUS THIN FILM PREPARED THEREBY" filed on Mar. 24, 2016. International Patent Application Serial No. PCT/KR2016/002977 claims priority to Korean Patent Application No. 10-2015-0074810, filed on May 28, 2015 and claims priority to Korean Patent Application No. 10-2015-0172253, filed on Dec. 4, 2015. The entire contents of each of the above-cited applications are hereby incorporated by reference for all purposes.

TECHNICAL FIELD

The present invention relates to a method of fabricating a black phosphorous thin film and a black phosphorous thin film thereof, and more particularly, to a method of fabricating a black phosphorous ultrathin film by forming the black phosphorous ultrathin film in a chamber by active oxygen and removing an accompanying black phosphorous oxide film using water.

BACKGROUND ART

In order to implement the future wearable electronic apparatus, a transparent display, or the like, it is necessary to develop an electronic device that is bent, is extensible, and has excellent performance.

Two-dimensional materials such as graphene, molybdenum disulfide, and the like, have been considered as a material for fabricating the next generation electronic device, after silicon. Recently, black phosphorus evaluated as a material that may substitute for molybdenum disulfide having a band gap is an allotrope having the same element as that of phosphorus, but having a property different from that of phosphorus, and is a material having iron gray metallic luster and having an appearance similar to that of graphite.

Particularly, the graphene has an insufficient direct electron band gap between a valence band and a conduction band, such that it has a limitation in substituting for silicon, which is a typical semiconductor, but the black phosphorus has a direct band gap that may be tuned depending on a thickness thereof, such that it may be operated in a wide wavelength range from a visible ray to a near infrared ray.

The band gap is a unique physical quantity of a material, and when the band gap is close to 0, a current easily flows in the material, such that the material becomes a conductor, and when the band gap becomes large, a current does not easily flow in the material, such that the material becomes an insulator. Therefore, when a magnitude of the band gap may be freely tuned, it is possible to manipulate an electrical property of the material from a conductor to a non-conductor.

In order to lower an operating voltage of a transistor and decrease heat generated in the transistor, the transistor should be designed at a very thin thickness of an atomic level. Therefore, many studies on the black phosphorus, which is a material satisfying this demand, have been conducted.

However, the black phosphorus is not stable due to a high reaction speed in the air, such that a natural oxide film is generated. The natural oxide film hinders a flow of current amount on a surface or an interface of the black phosphorus with the passage of time, thereby deteriorating properties of an electronic device. Therefore, a method of effectively removing the oxide film is necessarily required in order to use a black phosphorus thin film in the electronic device.

Meanwhile, the black phosphorus having bulk band energy of about 0.3 eV has high photoluminescence properties through direct transition regardless of a thickness, and may adjust variable band energy from a near infrared to a visible region particularly at 3 nm or less. Currently, a black phosphorus thin film may be formed by a mechanical exfoliation method. However, in the mechanical exfoliation method, it is very difficult to fabricate black phosphorus ultrathin film due to formation of a natural oxide film.

DISCLOSURE

Technical Problem

An object of the present invention is to provide a method of fabricating a black phosphorous ultrathin film and a black phosphorous ultrathin film fabricated by including a chamber in order to form a black phosphorous thin film having a high reaction speed to air as an ultrathin film and forming the black phosphorous ultrathin film by irradiating an ultraviolet ray into the chamber and etching the black phosphorous thin film through active oxygen generated by a reaction between oxygen and the ultraviolet ray, and removing a black phosphorous oxide film generated by a byproduct by water rinsing.

Technical Solution

In one general aspect, a method of fabricating a black phosphorous ultrathin film includes: forming a black phosphorous thin film; and forming the black phosphorous ultrathin film by irradiating an ultraviolet ray into a chamber and etching the black phosphorous thin film using active oxygen generated by a reaction between the irradiated ultraviolet ray and oxygen.

The black phosphorous thin film may be a black phosphorous thin film formed from pristine black phosphorous by a mechanical exfoliation method or a chemical vapor deposition method.

The method of fabricating a black phosphorous ultrathin film may further include removing a black phosphorous oxide film by treating the black phosphorous ultrathin film of which the etching is confirmed using water.

The method of fabricating a black phosphorous ultrathin film may further include confirming a thickness of the black phosphorous ultrathin film from which the black phosphorous oxide film is removed using any one or more of an optical image, a Raman spectroscopy, an atomic force microscope, and a scanning tunneling microscope.

The method of fabricating a black phosphorous ultrathin film may further include confirming etching of the black phosphorous ultrathin film using any one or more of an optical image and a Raman spectroscopy.

The chamber may be formed so that oxygen is continuously introduced thereinto and exhausted therefrom, and the oxygen may be introduced into the chamber in 100 to 600 sccm.

In another aspect, a black phosphorous ultrathin film fabricated by the method of fabricating a black phosphorous ultrathin film as described above has a surface roughness in a range of 1 nm or less in an area of 10 μm×10 μm.

The black phosphorous ultrathin film may have a thickness of 3 nm or less. The black phosphorous ultrathin film has one or two photoluminescence (PL) peaks at a wavelength of 700 to 1000 nm, the PL peaks comprising any one or two or more of a single PL peak by a black phosphorus single-atomic layer at a wavelength of 750 to 810 nm and a single PL peak by a black phosphorous two-atomic layer at a wavelength of 870 to 930 nm. In still another aspect, an optoelectronic device includes the black phosphorous ultrathin film as described above.

In yet still another aspect, a black phosphorous ultrathin film has a surface roughness in a range of 1 nm or less in an area of 10 μm×10 μm and a thickness of 8 nm or more. In yet still another aspect, a field effect transistor includes the black phosphorous ultrathin film as described above.

Advantageous Effects

The present invention fabricates a black phosphorous ultrathin film by etching a black phosphorous thin film using active oxygen in a chamber, thereby making it possible to efficiently fabricate a black phosphorous thin film having a desired thickness. In addition, the present invention may provide a black phosphorous ultrathin film having excellent electrical device properties by rinsing a surface.

Particularly, the present invention may be applied to optoelectronic devices including a photodiode, a light emitting diode, a solar cell, a photodetector, an optical switch, and the like, using photoluminescence properties of the black phosphorous ultrathin film, and may be applied to a field effect transistor due to excellent electron mobility.

BEST MODE

Hereinafter, the present invention will be described in detail with reference to the accompanying drawings. Technical terms and scientific terms used in the present specification have the general meaning understood by those skilled in the art to which the present invention pertains unless otherwise defined, and a description for the known function and configuration unnecessarily obscuring the gist of the present invention will be omitted in the following description.

In terms of the present invention, pristine black phosphorous means black phosphorous in a bulk crystalline state.

In terms of the present invention, a black phosphorous thin film means a thin film fabricated from pristine black phosphorous by a mechanical, physical, or chemical method.

In terms of the present invention, a black phosphorous ultrathin film means a black phosphorous ultrathin film fabricated by etching a black phosphorous thin film by active oxygen to adjust a thickness of the black phosphorous thin film. In detail, the black phosphorous ultrathin film may include a black phosphorous ultrathin film having a thickness of 0.5 nm to 3 nm that may be applied to an optoelectronic device, a black phosphorous ultrathin film having a thickness of 3 nm to 8 nm, and a black phosphorous ultrathin film having a thickness of 8 nm or more that may be applied to a field effect transistor, and may have a thickness of at most 500 nm. A thickness of the black phosphorous ultrathin film having the thickness of 8 nm or more may be preferably 100 nm or less, more preferably, 50 nm or less, and a thickness of the black phosphorous ultrathin film as an ultrathin film device may be preferably 30 nm or less.

Black phosphorous of the present invention is an allotrope having the same element as that of phosphorus, but having a property different from that of phosphorus, and is a material having iron gray metallic luster and having an appearance similar to that of graphite. The black phosphorous, which is a semiconductor material formed of phosphorous having several layers, has a layer structure like graphene. An interest in the black phosphorous as the next generation semiconductor material that will substitute for the graphene that does not have a band gap, such that it is difficult to control a flow of current has increased.

Since the black phosphorus has a band gap that may be tuned depending on a thickness thereof, the black phosphorous may be operated in a wide wavelength range from a visible ray to a near infrared ray, and shows excellent photoresponsivity and electron mobility of 1000 cm$^2$/Vs or more.

The black phosphorous has a direct band gap property, and has a band gap that may be tuned from about 0.3 eV to 1.5 eV depending on a thickness thereof. A black phosphorous ultrathin film having a thin thickness of 3 nm or less has excellent variable photoluminescence properties, such that it is advantageous in being applied to an optoelectronic device, and a black phosphorous ultrathin film having a thickness of 8 nm or more has excellent electron mobility, such that it is advantageous in being applied to a field effect transistor, or the like.

According to one aspect of the present invention, a method of fabricating a black phosphorous ultrathin film may include forming a black phosphorous thin film; and forming the black phosphorous ultrathin film by irradiating an ultraviolet ray into a chamber and etching the black phosphorous thin film using active oxygen generated by a reaction between the irradiated ultraviolet ray and oxygen.

The black phosphorous thin film used as a basic material for fabricating the black phosphorous ultrathin film may be fabricated from the pristine black phosphorous by a mechanical, physical, or chemical method.

In detail, the black phosphorous thin film may be fabricated by a method of fabricating a black phosphorous thin film to be described below, but is not limited thereto. That is, the method of fabricating a black phosphorous thin film may be a mechanical, physical, or chemical method as long as it is the known method of fabricating a black phosphorous thin film from the pristine black phosphorous, and these methods may be independently applied, and a combination of these methods may be applied. Likewise, it is to be construed that the method of fabricating a black phosphorous thin film is applied to both of one aspect to be described below or examples derived from a combination of two or more aspects. In this case, these contents applied to both of any one aspect and/or examples derived from a combination of two or more aspects will be generally called a general aspect of the present invention and will be described for the purpose of clear understanding.

According to one aspect of fabricating a black phosphorous thin film, a mechanical exfoliation method may be a method of exfoliating pristine black phosphorous in each layer using an adhesive material. In detail, the mechanical exfoliation method may include a method of mechanically exfoliating pristine black phosphorous using Scotch Tape, or the like.

According to another aspect of fabricating a black phosphorous thin film, a solvent exfoliation method of dispersing and exfoliating pristine black phosphorous in a solvent may be included. The solvent exfoliation method may include a method of fabricating a black phosphorous thin film by mixing the pristine black phosphorous in the solvent to fabricate a dispersant and agitating the dispersion or irradiating an ultrasonic wave to the dispersion to exfoliate the pristine black phosphorous. As the solvent, alcohol and an aprotic solvent may be selected. Here, as the alcohol, one or more kinds of alcohols selected from the group consisting of C1 to C8 may be used, and as the aprotic solvent, one or more kinds selected from the group consisting of tetrahydrofuran, hexane, methylene chloride, and toluene may be used. After the solvent is separated from the dispersion including the exfoliated black phosphorous thin film through the known means such as filtration, centrifugation, or the like, the black phosphorous thin film may be fabricated.

According to another aspect of fabricating a black phosphorous thin film, a chemical vapor deposition method may be a method of obtaining a black phosphorous thin film formed on a metal film by depositing a catalyst metal on a substrate to form a thin metal film, allowing black phosphorous gas to flow at a high temperature, and then performing cooling.

In a method of fabricating a black phosphorous thin film of which a thickness is decreased from the pristine black phosphorous through the mechanical, physical, or chemical method, it is difficult to precisely adjust the thickness of the black phosphorous thin film, and a surface roughness of the black phosphorous thin film in a large area is non-uniform or the black phosphorous thin film includes many defects. Even though the black phosphorous having a thin film form is fabricated through the mechanical, physical, or chemical method, the black phosphorous thin film fabricated by the method of fabricating a black phosphorous thin film may not be adjusted to have an ultrathin film form having a thickness of 3 nm or less, and is non-uniform or has defects, such that an application of the black phosphorous thin film to an optoelectronic device or a field effect transistor is limited.

Therefore, a black phosphorous ultrathin film in which a thickness of a black phosphorous thin film is precisely adjusted, a surface roughness of the black phosphorous thin film in a large area is minimized, and a defect is not substantially present, and a method of fabricating the same are provided. The black phosphorous ultrathin film is fabricated by etching a black phosphorous thin film by active oxygen to adjust a thickness of the black phosphorous thin film to a desired thickness.

According to one aspect of the present invention, a process of fabricating a black phosphorous ultrathin film may be performed in a chamber due to a problem that the black phosphorous thin film is not stable due to a high reaction speed in the air.

An apparatus of fabricating a black phosphorous ultrathin film may include a chamber formed to be sealable and formed so that oxygen may be introduced thereinto and be exhausted therefrom, and a sample table formed in the chamber and having a black phosphorous thin film positioned thereon.

In addition, the apparatus of fabricating a black phosphorous ultrathin film may include an ultraviolet ray irradiating unit irradiating an ultraviolet ray in order to generate active oxygen in the chamber. The chamber includes an ultraviolet ray inlet disposed at one side thereof and having the ultraviolet ray introduced thereinto, and it is preferable that the ultraviolet ray inlet is provided at a position at which the ultraviolet ray may be irradiated without interference and a position at which it may be easily confirmed whether or not the black phosphorous thin film is etched.

It is preferable that the ultraviolet ray inlet is formed of quartz having excellent ultraviolet ray transmissivity. In this case, it is preferable that the quartz has a thickness of 0.1 to 0.5 mm, which is to use a high magnification objective lens having a small working distance at the time of performing observation using an optical image or a Raman spectroscopy. A material of the ultraviolet ray inlet is not limited to the quartz described above. That is, various materials may be used as the material of the ultraviolet ray inlet as long as they have excellent ultraviolet ray transmissivity and facilitate observation through an objective lens.

According to one aspect of the present invention, a black phosphorous ultrathin film having a thin thickness may be formed by irradiating an ultraviolet ray into the chamber and etching black phosphorous using active oxygen generated in a process of generating ozone through a reaction between the irradiated ultraviolet ray and oxygen.

When oxygen ($O_2$) gas is injected into the chamber simultaneously with irradiation of the ultraviolet ray into the chamber, the oxygen gas may repeat decomposition into and bonding to ozone ($O_3$) and monoatomic active oxygen (O) by energy of the ultraviolet ray. The active oxygen, which is oxygen having chemical reactivity richer than oxygen, may serve as an oxidizing agent etching a surface of the black phosphorous thin film.

The black phosphorous ultrathin film may be formed by forming the ozone and the active oxygen by a reaction between the oxygen and the ultraviolet ray within the chamber and etching the black phosphorous thin film by the active oxygen.

In the etching reaction, etching may be sequentially performed depending on sizes of surface areas of surface defects on the black phosphorous thin film. That is, small defects having a size of hundreds of nanometers or less may be first etched by the etching reaction that is selected generated, and defects having a size of hundreds of nanometers or more may be etched and removed from an edge.

Most of the surface defects present on the black phosphorous thin film may be substantially removed by sequential reaction properties of the etching reaction, and a surface roughness may also be precisely adjusted in a range of 1 nm or less in an area of 10 μm×10 μm.

In addition, in the forming of the black phosphorous ultrathin film, it is preferable that oxygen is introduced into the chamber in about 100 to 600 standard cubic centimeter per minute (sccm) and 1 atm is maintained only by the oxygen in the chamber, but is not limited thereto.

A temperature in the chamber is 15 to 45° C., the irradiated ultraviolet ray has a wavelength of 180 to 250 nm, a desired thickness may be adjusted depending on an amount of irradiated light, and the light is irradiated by an output of 10 to 30 mW to form the black phosphorous ultrathin film, which is preferable since the light and the oxygen uniformly react to each other without a side reaction, but is not limited thereto.

The thickness of the black phosphorous ultrathin film according to the present invention may be in proportion to a reaction level to the black phosphorous depending on amounts of generated ozone and active oxygen. A wavelength of the light may be in a range of 180 to 250 nm, and light having a wavelength of 189 nm may be preferable in order to generate the active oxygen by decomposing a double bond of the oxygen. As an amount of irradiated light becomes high or strength of the light becomes strong, a thickness of the black phosphorous ultrathin film obtained in a unit time may become small. However, the thickness of the black phosphorous ultrathin film according to the present invention is not obtained only depending on a specific amount of irradiated light and a specific strength of the light, and various combinations of the two variables described above are possible in order to obtain a specific thickness of the black phosphorous ultrathin film, and these combinations also fall with the scope of the present invention.

As described above, the apparatus of fabricating a black phosphorous ultrathin film according to the present invention directly generates the ozone and the active oxygen by the reaction between the oxygen and the ultraviolet ray in the process of etching the black phosphorous and forms the black phosphorous ultrathin film using the active oxygen, such that it does not need to include a separate active oxygen generating apparatus, thereby making it possible to decrease a fabricating cost.

The apparatus of fabricating a black phosphorous ultrathin film described above is only one aspect for generating the active oxygen in the present invention, and the method of fabricating a black phosphorous ultrathin film according to the present invention is not limited thereto. That is, various modifications in a size and a form of the chamber, supply and exhaust of the oxygen, and the like, may be made as long as the active oxygen may be generated and the black phosphorous thin film may be etched by the active oxygen, and these modifications also fall within the scope of the present invention.

According to one aspect of the present invention, the method of fabricating a black phosphorous ultrathin film may further include confirming etching of the black phosphorous ultrathin film using any one or more of the optical image or the Raman spectroscopy.

In addition, in the etching of the black phosphorous ultrathin film, it may be relatively confirmed whether or not the black phosphorous ultrathin film is etched depending on a time zone in which the ultraviolet ray is irradiated in order to confirm whether or not the black phosphorous ultrathin film is accurately etched. In this case, it is confirmed whether or not the black phosphorous ultrathin film is etched using the optical image or the Raman spectroscopy, and in the case in which the black phosphorous ultrathin film is not etched, the black phosphorous ultrathin film should be again etched. Therefore, it is efficient and preferable to confirm whether or not the black phosphorous ultrathin film is etched in a state in which the black phosphorous ultrathin film is provided in the chamber, but is not limited thereto.

According to one aspect of the present invention, the method of fabricating a black phosphorous ultrathin film may further include removing a black phosphorous oxide film by treating the black phosphorous ultrathin film of which the etching is confirmed using water. The black phosphorous oxide film is a liquid phase oxide film ($P_xO_y$, absorbing water) generated by the active oxide, and in the present invention, as a non-restrictive specific example, the black phosphorous ultrathin film may be rinsed using the water to remove the black phosphorous oxide film and the surface defects of the black phosphorous ultrathin film.

The black phosphorous ultrathin film is treated using the water, such that the black phosphorous oxide film present on a surface of the black phosphorous ultrathin film is selectively removed, the surface of the black phosphorous ultrathin film becomes flat, and the black phosphorous thin film having a uniform thickness may be obtained.

According to one aspect of the present invention, a method of removing the black phosphorous oxide film may be a method of submerging the black phosphorous ultrathin film in the water to rinse the black phosphorous ultrathin film, a method of directly spraying water to the black phosphorous ultrathin film to rinse the black phosphorous ultrathin film, a method of rinsing the black phosphorous ultrathin film using a cleaning apparatus, and the like, as a non-restrictive specific example, but is not limited thereto.

According to one aspect of the present invention, the water used for rinsing the black phosphorous ultrathin film may be distilled water or deionized water, but is not limited thereto as long as a property of the water is maintained.

In a method of using the cleaning apparatus, for example, through a spin type cleaner, the black phosphorous ultrathin film is disposed on a chuck that is rotatable, and water is sprayed to the black phosphorous ultrathin film while rotating the chuck in one direction, thereby making it possible to remove the black phosphorous oxide film and foreign materials.

In the case in which the black phosphorous ultrathin film contacts the water, a temperature at which the black phosphorous ultrathin film is rinsed using the water may be 1° C. to 70° C., and a time in which the black phosphorous ultrathin film contacts the water may be 10 seconds to 10 hours. In a temperature range of 1° C. to 70° C., the black phosphorous oxide film present on the black phosphorous ultrathin film may be selectively removed. Preferably, in a temperature range of 5° C. to 50° C., the black phosphorous oxide film present on the black phosphorous ultrathin film may be selectively removed at the fastest speed. In the case in which a temperature range is out of the range described above, the black phosphorous oxide film is not perfectly removed or black phosphorous is rapidly etched, which may not be preferable. The black phosphorous oxide film may be removed in a contact time between the black phosphorous ultrathin film and the water of 10 second to 10 hours. Preferably, the black phosphorous oxide film may be effectively removed in a contact time between the black phosphorous ultrathin film and the water 20 seconds to five minutes. In the case in which the contact time is out of the range described above, the black phosphorous oxide film is not removed, the black phosphorous is etched, or process efficiency may be deteriorated, which may not be preferable.

According to one aspect of the present invention, various modifications may be made in order to form the black phosphorous ultrathin film. For example, after the black phosphorous thin film is etched through the active oxygen and a rinsing process of rinsing the black phosphorous ultrathin film using water is performed, an active oxygen etching process through irradiation of an ultraviolet ray may be again performed, and the processes described above may be repeatedly performed several times, and the rinsing process may be arbitrarily omitted. Preferably, in order to fabricate a black phosphorous ultrathin film having a thickness of 3 nm or less, the rinsing process may be added or omitted depending on a thickness of the black phosphorous ultrathin film since etching is rapidly performed by oxygen, moisture, and light at the time of exposure to the air, and particularly, it may be required to form a surface passivation layer in order to fabricate a stably electrical device and measure properties.

According to one aspect of the present invention, the method of fabricating a black phosphorus thin film from which the black phosphorus oxide film is removed, may also include a method of fabricating a black phosphorous ultrathin film by omitting a process of etching the black phosphorous thin film using the active oxygen and treating the black phosphorous thin film using the water to remove the black phosphorous oxide film.

According to one aspect of the present invention, the method of fabricating a black phosphorous ultrathin film may further include confirming a thickness of the black phosphorous ultrathin film from which the black phosphorous oxide film is removed.

In this case, it is preferable to confirm the thickness of the black phosphorous ultrathin film from which the black phosphorous oxide film is removed using any one or more of an optical image, a Raman spectroscopy, an atomic force microscope (AFM), and a scanning tunneling microscope (STM).

The present invention provides a black phosphorous ultrathin film fabricated through the method described above.

The black phosphorous ultrathin film according to the present invention may be a black phosphorous ultrathin film stacked as one layer to five layers, and may have a thickness of 3 nm or less. The black phosphorous ultrathin film having a thin thickness of 3 nm or less has excellent light emission and light absorption properties by tuning of a band gap from a near infrared to a visible region, such that it may be applied to an optoelectronic device. The optoelectronic device, which is a device converting optical energy into electric energy or converting electric energy into optical energy, may include a photodiode, a light emitting diode, a solar cell, a photodetector, an optical switch, and the like.

In addition, a thickness and a surface roughness of the black phosphorous thin film fabricated by the present invention may be confirmed using an AFM, an STM, or the like.

Particularly, the AFM directly measure atomic force of a surface using an end of a tip formed of a very thin metal or silicon, which is a semiconductor, thereby making it possible to accurately measure the thickness of the black phosphorous ultrathin film.

A surface roughness of the black phosphorous ultrathin film according to the present invention may be measured by an AFM, and a surface roughness of the black phosphorous ultrathin film in an area of 10 μm×10 μm may be 1 nm or less.

A thickness of the black phosphorous ultrathin film according to the present invention may be measured through the Raman spectroscopy, which may perform measurement by a phonon depending on a vibration movement scheme when black phosphorous atoms have a predetermined lattice structure. In the black phosphorous ultrathin film according to the present invention, an $A^1_g$ mode vibrating in a direction perpendicular to a lattice plane, a $B_{2g}$ mode vibrating in a direction parallel with the lattice plane, and an $A^2_g$ mode may be measured through the Raman spectroscopy.

In addition, photoluminescence (PL) properties of the black phosphorous ultrathin film according to the present invention may be measured. This method may measure emission of light generated when electrons of a sample are excited and then become a steady state, using a phenomenon that light emission is induced by irradiating light having a specific wavelength to the sample.

The black phosphorous ultrathin film according to the present invention has one or two photoluminescence (PL) peaks at a wavelength of 700 to 1000 nm, the PL peaks comprising any one or two or more of a single PL peak by a black phosphorus single-atomic layer at a wavelength of 750 to 810 nm and a single PL peak by a black phosphorus two-atomic layer at a wavelength of 870 to 930 nm.

According to an exemplary embodiment of the present invention, a black phosphorous ultrathin film having the single-atomic layer and the two-atomic layer may be fabricated, and PL of the single-atomic layer was measured at about 780 nm and PL of the two-atomic layer was measured at about 900 nm. The black phosphorous ultrathin film may be applied to the optoelectronic device such as the photodiode, the light emitting diode, the solar cell, the photodetector, the optical switch, and the like.

The black phosphorous ultrathin film according to the present invention may be a black phosphorous ultrathin film having a thickness of 8 nm or more. When a thickness of the black phosphorous ultrathin film is 8 nm or more, the black phosphorous ultrathin film has a bulk band gap of about 0.3 eV, may have excellent electron mobility, more specifically, electron mobility of 1000 $cm^2$/Vs or more, and may be easily applied to an electronic device affected by surface properties. This black phosphorous ultrathin film may be a high quality black phosphorous ultrathin film having excellent electrical properties, and may be applied to a field effect transistor, or the like.

Hereinafter, the present invention will be described in more detail through Inventive Examples. However, the following Inventive Examples are only one reference example for describing the present invention in detail, and the present invention is not limited thereto.

[Property Evaluation]

1. AFM Measuring Method:

AFM (Part system XE-70) measurement was performed at a scanning speed of 0.4 Hz in room temperature. A surface roughness was measured by calculating a root mean squared (RMS) roughness of a surface step from a three-dimensional surface image measured at a size of 10 μm×10 μm, using an XEI program (version 1.6.5) purchased together with an AFM equipment.

2. Raman Analyzing Method

Raman analysis was performed using a home-built confocal Raman system (EMCCD, Tunable Ar ion laser, 457-514 nm).

3. PL Measuring Method

Measurement was performed at Nd:YAG (532 nm) and Tunable Ar ion laser (488 nm), and a laser output was 0.1 mW or less in order to decrease damage to black phosphorous.

Inventive Example 1

Black phosphorous bulk crystal (99.99%, smart elements) was mechanically exfoliated on a $SiO_2$/Si substrate having a thickness of 285 nm using Scotch Tape (3M) to fabricate a black phosphorous thin film.

The black phosphorous thin film was positioned on a sample table of an optical cell having an internal volume of 40 ml in order to perform ultraviolet ray treatment. The optical cell was formed of quartz glass (077 Vitreosil® Optical Fused Quartz) having a thickness of 0.17 mm so that an ultraviolet ray may be introduced thereonto. $O_2$ gas was introduced into the optical cell in 500 sccm to maintain a 1 atm oxygen environment.

The ultraviolet ray was UV-irradiated by a pencil mercury lamp (Oriel, 6035), and lamp power was 19 mW at 200 nm. The ultraviolet ray was irradiated for 30 minutes to fabricate a black phosphorous ultrathin film (A: 14.6→8.1 nm, B: 26.3→20.1 nm) of which a thickness of about 6 nm is etched.

The black phosphorous thin film was formed on the $SiO_2$/Si substrate, and the black phosphorous ultrathin film etched by active oxygen generated by the irradiation of the ultraviolet ray was dipped in a beaker in which deionized water is put and was then rinsed for one minute.

Inventive Example 2

A black phosphorous thin film was fabricated by performing all processes in the same scheme as that of Inventive Example 1 except that ultraviolet ray is irradiated for 10 minutes.

Inventive Example 3

A black phosphorous thin film was fabricated by performing all processes in the same scheme as that of Inventive Example 1 except that ultraviolet ray is irradiated for 20 minutes.

Inventive Example 4

A black phosphorous thin film was fabricated by performing all processes in the same scheme as that of Inventive Example 1 except that ultraviolet ray is irradiated for 31 minutes.

Comparative Example 1

A black phosphorous thin film was fabricated by performing all processes in the same scheme as that of Inventive Example 1 except that ultraviolet ray is not irradiated.

Inventive Example 5 Fabrication of Transistor Device of Black Phosphorus Thin Film Black phosphorous bulk crystal (99.99%, smart elements) was mechanically exfoliated on a SiO2/Si substrate having a thickness of 285 nm using Scotch Tape (3M).

In addition, a device for transistor measurement was fabricated through an e-beam lithography method with respect to a black phosphorous thin film having a thickness of 30 nm, and properties of an electronic device were measured in vacuum.

The device fabricated as described above was dipped in a beaker in which deionized water is put and was then rinsed for one minute.

Evaluation Result

Figure 1:
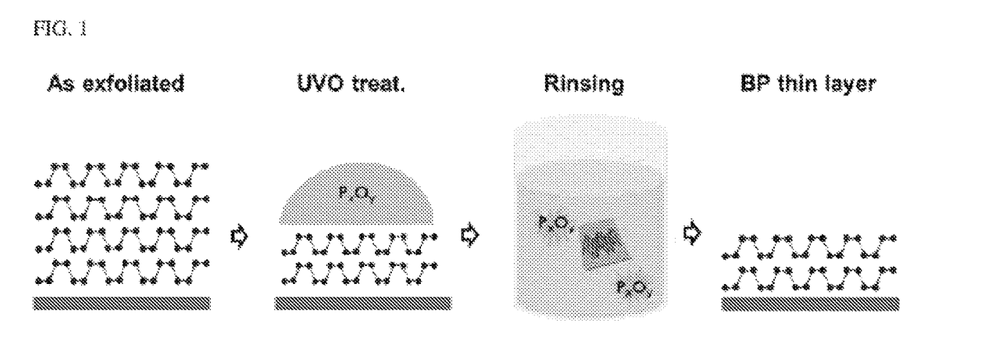
FIG. 1 is a view illustrating a method of fabricating a black phosphorous ultrathin film according to the present invention.
Figure 2:
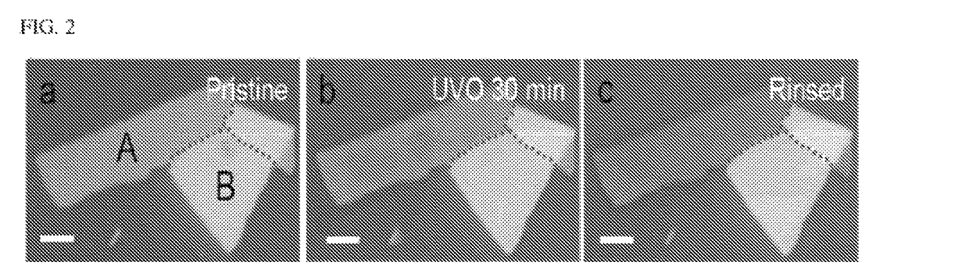
FIG. 2a, FIG. 2b and FIG. 2c illustrates optical images of a black phosphorous ultrathin film according to the present invention.
Figure 3:
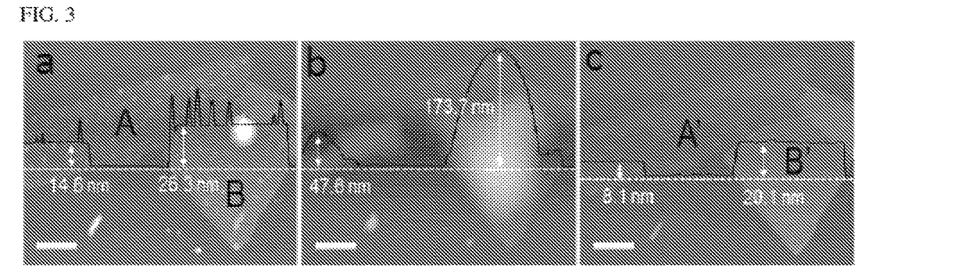
FIG. 3a, FIG. 3b and FIG. 3c illustrates surfaces of a black phosphorous ultrathin film according to the present invention measured by an atomic force microscope (AFM).

FIG. 2a, FIG. 2b and FIG. 2c is optical image results according to Inventive Example 1. In addition, FIG. 3a, FIG. 3b and FIG. 3c is measurement results of regions A and B of FIG. 2a, FIG. 2b and FIG. 2c by an AFM. a of FIG. 2a and FIG. 3a illustrate a black phosphorous ultrathin film by mechanical exfoliation. An image was obtained within 20 minutes after mechanical exfoliation, but it may be appreciated that a surface is not uniform. This roughness is due to an oxide generated on a surface of black phosphorous, and a surface roughness of a pristine black phosphorous was measured to be 5.1 nm in a region A and was measured to be 5.4 nm in a region B.

FIG. 2b and FIG. 3b are images illustrating a black phosphorous oxide film generated by a reaction between active oxide and the black phosphorous after irradiating an ultraviolet ray, and a thickness of the black phosphorous oxide film was measured to be about 174 nm in a region B. Therefore, it might be appreciated that the black phosphorous oxide film absorbs water due to high hydrophilicity of the black phosphorous, such that a thickness of a surface is significantly changed. The black phosphorous oxide film may be removed by deionized water, which is illustrated in FIG. 2c and FIG. 3c. A thickness change after rinsing the black phosphorous ultrathin film in an initial black phosphorous state was confirmed to be about 5.5 nm, and a smooth surface of the black phosphorous ultrathin film may be confirmed. A surface roughness was confirmed to be 1 nm or less in an area of 10 μm×10 μm.

Figure 4:
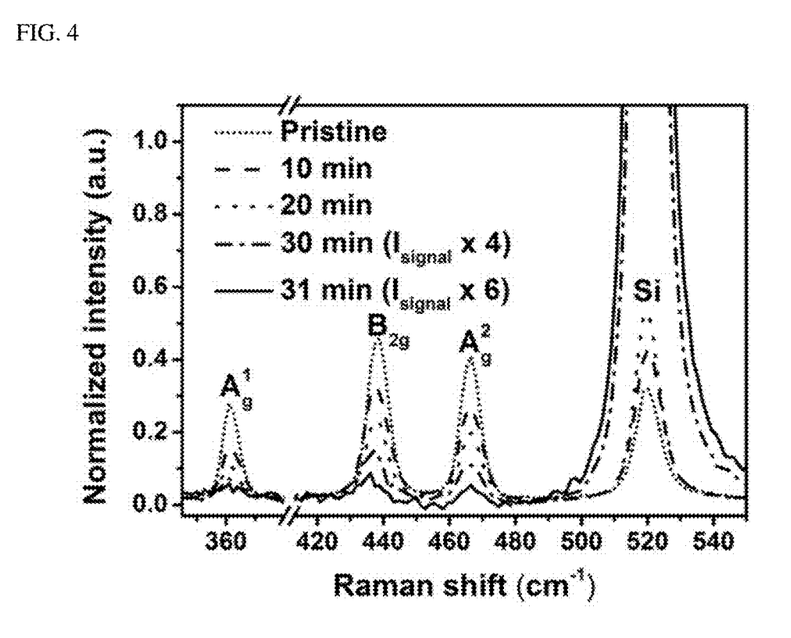
FIG. 4 illustrates Raman spectra of formation of a black phosphorous ultrathin film according to the present invention.

FIG. 4 illustrates results of Raman spectra ($A^1_g$, $B_{2g}$, and $A^2_g$) of black phosphorous ultrathin films fabricated by Inventive Examples 1 to 4, and position changes of Raman peaks of the black phosphorous ultrathin films depending on an UV irradiation time have been confirmed. Thicknesses of the black phosphorous ultrathin films were decreased depending on the UV irradiation time, $A^1_g$ and Si Raman band signal magnitude ratios were changed and peak positions of $B_{2g}$ and $A^2_g$ bands were changed as the thicknesses of the black phosphorous ultrathin films are decreased, and ultrathin films of a single layer might be confirmed through a peak difference value between the $B_{2g}$ and $A^2_g$ bands of which the positions are changed.

Figure 5:
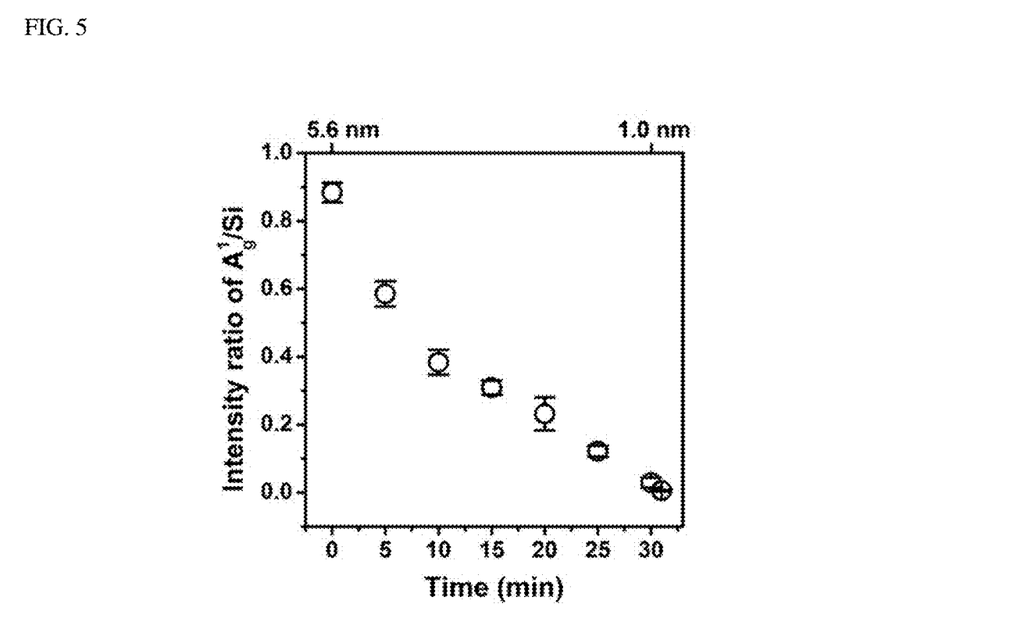
FIG. 5 illustrates a signal magnitude ratio of Raman spectra of formation of a black phosphorous ultrathin film according to the present invention.

FIG. 5 illustrates observation results of signal magnitude ratios of $A^1_g$ and Si bands in a Raman spectrum of FIG. 4 depending on a UV irradiation time. In the case of 0.1 or less, the black phosphorous ultrathin films were confirmed to have a thickness of about 3 nm or less.

Figure 6:
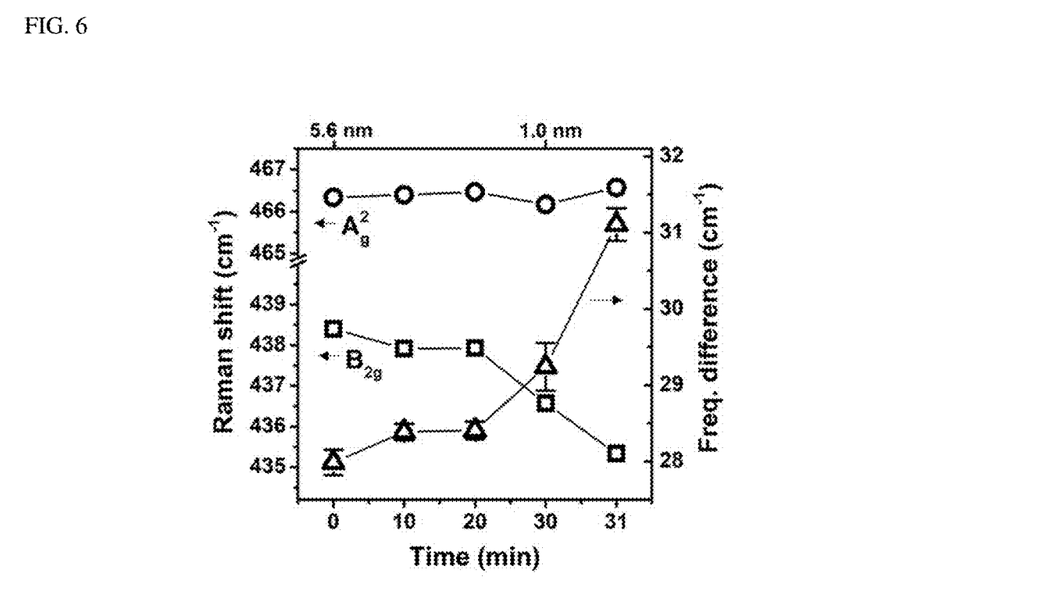
FIG. 6 illustrates a peak difference of Raman spectra of formation of a black phosphorous ultrathin film according to the present invention.

FIG. 6 illustrates peak difference values of $B_{2g}$ and $A^2_g$ bands of the black phosphorous ultrathin films of FIG. 4 depending on a UV irradiation time. In a UV irradiation time less than 20 minutes, the black phosphorous ultrathin films have a thickness of 3 nm or more, and there was no large change in peak difference values. However, in a UV irradiation time of 20 minutes or more, peak difference values were rapidly increased, which means that thicknesses of the black phosphorous ultrathin films are gradually decreased to 3 nm or less. In a UV irradiation time of 30 minutes, black phosphorous ultrathin films having a two-atomic layer were formed, and in a UV irradiation time of 31 minutes, black phosphorous ultrathin films having a single-atomic layer were formed.

Figure 7:
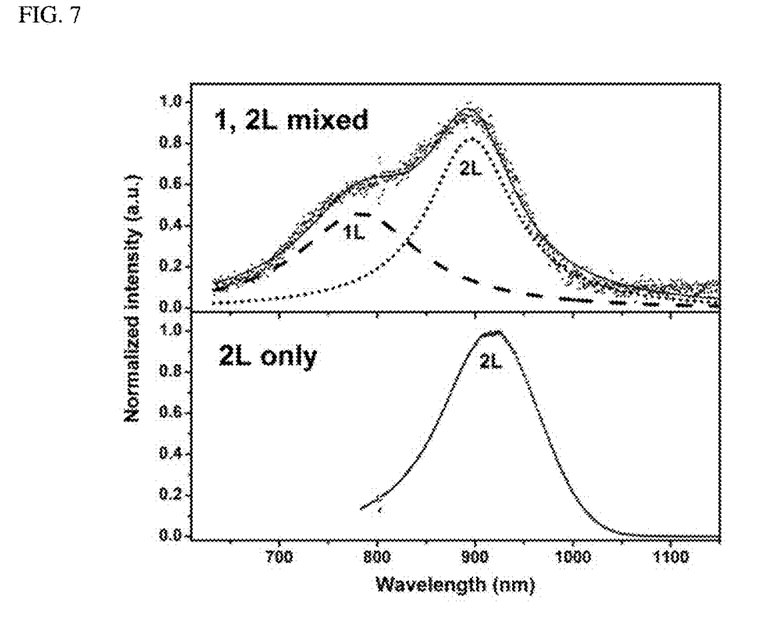
FIG. 7 illustrates PL spectra of black phosphorous ultrathin films having a single-atomic layer and a two-atomic layer according to the present invention.

FIG. 7 illustrates PL spectra of black phosphorous ultrathin films having a single-atomic layer and a two-atomic layer, fabricated by Inventive Example 1. In the spectra, two PL peaks to which the single-atomic layer and the two-atomic layer contribute, respectively, were clearly obtained, and the black phosphorous ultrathin films having the single-atomic layer and the two-atomic layer have obtained strong property PL peaks at 782 nm and 896 nm, respectively, by separating peaks by deconvolution. In detail, the black phosphorous ultrathin film having the two-atomic layer has obtained a strong property PL peak of about 1,000 photon counts at 488 nm, an output of 0.01 mW, and 60 seconds.

Since it has been known that a black phosphorous single-atomic layer and a black phosphorous two-atomic layer have central values of PL spectra at about 780 nm and about 900 nm, respectively, it may be confirmed that nanometer level surface defects attenuating PL signal magnitudes are not present on surfaces of the black phosphorous ultrathin films.

Meanwhile, a black phosphorous thin film fabricated by only a mechanical exfoliation method shows PL of a mid-infrared region, while the black phosphorous ultrathin film having the single-atomic layer or the two-atomic layer obtained by the UV irradiation according to the present invention shows a strong PL spectrum in near infrared and visible regions. Therefore, it may be confirmed that the black phosphorous thin film fabricated by a general mechanical exfoliation method shows bulk properties having many defect on a surface thereof, while the black phosphorous ultrathin film having the single-atomic layer and the two-atomic layer according to the present invention is a high-quality ultrathin film material having a surface that does not have defects and is uniform in a large area.

Figure 8:
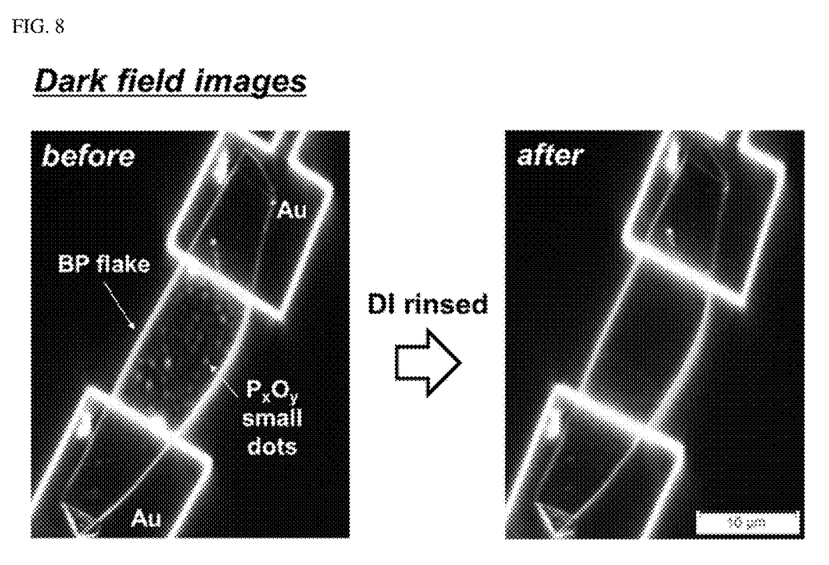
FIG. 8 is optical images of a transistor device fabricated using a black phosphorous thin film according to the present invention.

FIG. 8 illustrates optical images of a transistor device using a black phosphorous thin film having a thickness of 30 nm, fabricated by Inventive Example 5. Dark field images before (left) and after (right) the black phosphorous thin film is rinsed using deionized water are illustrated, and it may be confirmed that a significant amount of black phosphorous oxide film is present on the transistor device before the black phosphorous thin film is rinsed using the deionized water, but the black phosphorous oxide film is completely removed after the black phosphorous thin film is rinsed using deionized water.

Figure 9:
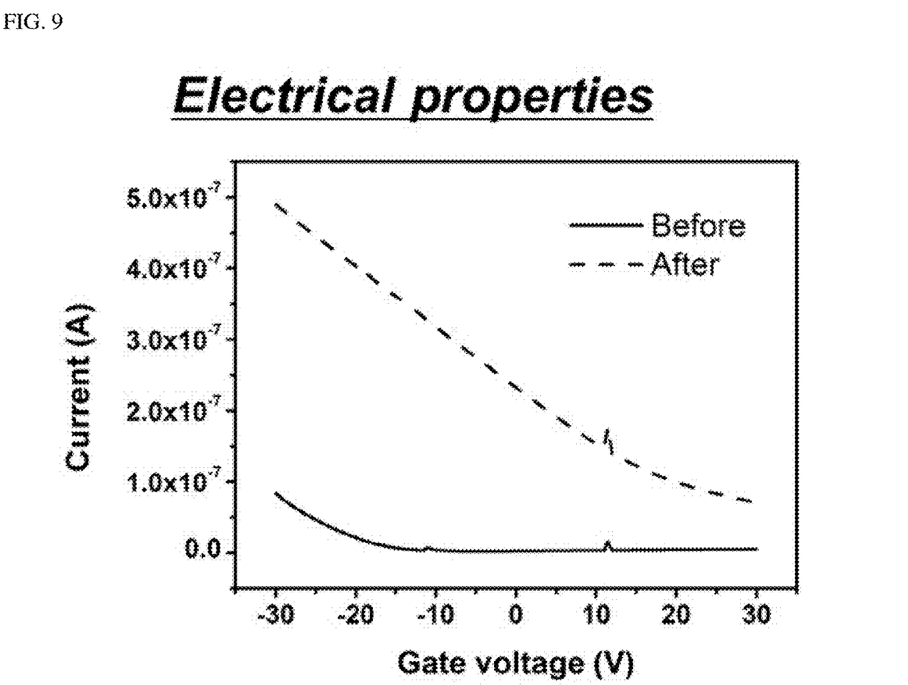
FIG. 9 is a graph illustrating evaluation results of electrical properties of a black phosphorous thin film according to the present invention.

FIG. 9 illustrates electrical properties of a transistor device by measuring amounts of current flowing to two metal electrodes depending on a change in a gate electrode after a positive electrode and a negative electrode are applied to the two metal electrodes and the gate electrode is connected to Si below $SiO_2$, as illustrated in FIG. 8. In detail, a result before the black phosphorous thin film is rinsed using the deionized water shows a lower current value with respect to a voltage change as illustrated in FIG. 9 due to the black phosphorous oxide film, while a result after the black phosphorous thin film is rinsed using the deionized water shows that an amount of current is increased and properties of the transistor device are significantly improved.

Therefore, it was confirmed that the rinsing process by the water is a means that may solve rapid deterioration of electrical properties of electrical devices such as the transistor device, and the like, including the black phosphorous thin film or the black phosphorous ultrathin film due to the black phosphorous oxide film in various electrical devices.

A control of a thickness and a uniform surface of the black phosphorous thin film is an important precondition for the next generation material. In the present invention, the black phosphorous thin film was etched by the active oxygen to adjust a thickness to a desired ultrathin film thickness, a thickness of 3 nm or less was confirmed by Raman, and excellent photoluminescence properties were confirmed by PL. In addition, the black phosphorous thin film was treated using the water to remove the black phosphorous oxide film, thereby making a surface of the black phosphorous thin film uniform, such that improvement of properties of the electrical device was confirmed.

Hereinabove, although the present invention has been described with reference to exemplary embodiments and the accompanying drawings, the present invention is not limited thereto, but may be variously modified and altered by those skilled in the art to which the present invention pertains without departing from the spirit and scope of the present invention claimed in the claims.

The invention claimed is:

1. A method of fabricating a black phosphorous ultrathin film, comprising:
   forming a black phosphorous thin film; and
   forming the black phosphorous ultrathin film by irradiating an ultraviolet ray into a chamber and
   etching the black phosphorous thin film using active oxygen generated by a reaction between the irradiated ultraviolet ray and oxygen.

2. The method of fabricating a black phosphorous ultrathin film of claim 1, wherein the black phosphorous thin film is a black phosphorous thin film formed from pristine black phosphorous by a mechanical exfoliation method or a chemical vapor deposition method.

3. The method of fabricating a black phosphorous ultrathin film of claim 1, further comprising confirming etching of the black phosphorous ultrathin film using any one or more of an optical image and a Raman spectroscopy.

4. The method of fabricating a black phosphorous ultrathin film of claim 3, further comprising removing a black phosphorous oxide film by treating the black phosphorous ultrathin film of which the etching is confirmed using water.

5. The method of fabricating a black phosphorous ultrathin film of claim 4, further comprising confirming a thickness of the black phosphorous ultrathin film from which the black phosphorous oxide film is removed using any one or more of an optical image, a Raman spectroscopy, an atomic force microscope, and a scanning tunneling microscope.

6. The method of fabricating a black phosphorous ultrathin film of claim 1, wherein the chamber is formed so that oxygen is continuously introduced thereinto and exhausted therefrom.

7. The method of fabricating a black phosphorous ultrathin film of claim 6, wherein the oxygen is introduced into the chamber in 100 to 600 sccm.

8. The black phosphorous ultrathin film fabricated by the method of fabricating a black phosphorous ultrathin film of claim 1 and having a surface roughness in a range of 1 nm or less in an area of 10 μm×10 μm.

9. The black phosphorous ultrathin film of claim 8, wherein the black phosphorous ultrathin film has a thickness of 3 nm or less.

10. The black phosphorus ultrathin film of claim 9, wherein the black phosphorus ultrathin film has one or two photoluminescence (PL) peaks at a wavelength of 700 to 1000 nm, the PL peaks comprising any one or two or more of a single PL peak by a black phosphorus single-atomic layer at a wavelength of 750 to 810 nm and a single PL peak by a black phosphorus two-atomic layer at a wavelength of 870 to 930 nm.

11. The optoelectronic device comprising the black phosphorous ultrathin film of claim 9.

12. A black phosphorous ultrathin film fabricated by the method of fabricating a black phosphorous ultrathin film of claim 1 and having a surface roughness in a range of 1 nm or less in an area of 10 μm×10 μm and a thickness of 8 nm or more.

13. A field effect transistor comprising the black phosphorous ultrathin film of claim 12.

* * * * *